United States Patent
Su et al.

(10) Patent No.: US 7,098,082 B2
(45) Date of Patent: Aug. 29, 2006

(54) MICROELECTRONICS PACKAGE ASSEMBLY TOOL AND METHOD OF MANUFACTURE THEREWITH

(75) Inventors: Chao-Yuan Su, Hsin-Chu (TW); Hsin-Hui Lee, Hsin-Chu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 116 days.

(21) Appl. No.: 10/822,961

(22) Filed: Apr. 13, 2004

(65) Prior Publication Data

US 2005/0227409 A1     Oct. 13, 2005

(51) Int. Cl.
*H01L 21/48* (2006.01)

(52) U.S. Cl. .............. 438/127; 438/124; 438/126; 438/125

(58) Field of Classification Search .......... 438/127, 438/124, 126, 125
See application file for complete search history.

(56) References Cited

U.S. PATENT DOCUMENTS

| | | | |
|---|---|---|---|
| 5,998,243 A * | 12/1999 | Odashima et al. | 438/127 |
| 6,019,588 A * | 2/2000 | Peters et al. | 425/125 |
| 6,163,072 A | 12/2000 | Tatoh | |
| 6,350,631 B1 * | 2/2002 | Kobayashi et al. | 438/107 |
| 6,413,801 B1 * | 7/2002 | Lin | 438/127 |
| 6,451,625 B1 | 9/2002 | Pu et al. | |
| 6,472,252 B1 | 10/2002 | Mess | |
| 6,484,394 B1 | 11/2002 | Heo et al. | |
| 6,555,412 B1 | 4/2003 | Wensel | |
| 6,555,924 B1 | 4/2003 | Chai et al. | |
| 6,558,980 B1 | 5/2003 | Miyaki et al. | |
| 6,560,117 B1 | 5/2003 | Moon | |
| 6,562,272 B1 | 5/2003 | Chang et al. | |
| 6,563,207 B1 | 5/2003 | Shinma | |
| 6,612,175 B1 * | 9/2003 | Peterson et al. | 73/708 |
| 6,911,092 B1 * | 6/2005 | Sneh | 118/715 |
| 2003/0067071 A1 | 4/2003 | Cardwell | |
| 2003/0090006 A1 | 5/2003 | Farnworth | |
| 2004/0190299 A1 * | 9/2004 | Chapman | 362/394 |

FOREIGN PATENT DOCUMENTS

JP          402038303 A  *  2/1990

* cited by examiner

*Primary Examiner*—Luan Thai
(74) *Attorney, Agent, or Firm*—Haynes and Boone, LLP

(57) ABSTRACT

A method of manufacturing a microelectronic package comprising, in one embodiment, providing a package substrate, coupling a device substrate to the package substrate, and assembling a bifurcated mold around the device and package substrates, the bifurcated mold including a seal. The method also includes encapsulating the device and package substrates employing the bifurcated mold.

22 Claims, 2 Drawing Sheets

MICROELECTRONICS PACKAGE ASSEMBLY TOOL AND METHOD OF MANUFACTURE THEREWITH

BACKGROUND

The present disclosure relates generally to microelectronics packaging and, more specifically, to manufacturing a microelectronics package with a sealed bifurcated mold.

Flip-chip ball grid array (FCBGA) packaging generally employs a plurality of solder bump balls that may be coupled between bond pads of a microelectronics device substrate and a package substrate. An encapsulant is typically applied to back-fill the bonded device substrate and BGA while the package is housed in a mold. However, during encapsulation, encapsulant or flash mold material can leak from the mold, the package/substrate interface and/or other gaps/cracks. The mold material is difficult to remove and can deteriorate proximate electrical contacts. The excess encapsulate is also difficult to remove from the mold, therefore requiring frequent cleaning.

Accordingly, what is needed in the art is a device and manufacturing method that addresses the above discussed issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
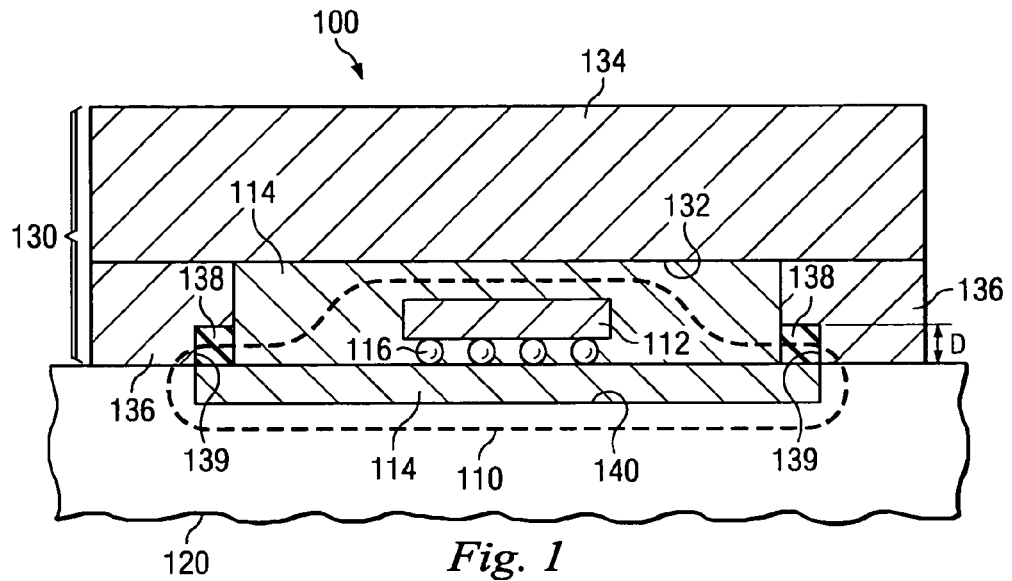
FIG. 1 illustrates a sectional view of one embodiment of a microelectronic package assembly tool during assembly of a microelectronic package according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of one embodiment of a microelectronic package assembly tool 100 during assembly of a microelectronic package 110 according to aspects of the present disclosure. The assembly tool 100 is bifurcated, having a base or foundation (hereafter collectively referred to as the base) 120 and a body 130. The microelectronic package 110 includes a device substrate 112 and a package substrate 114. Although any means for coupling the device and package substrates 112, 114 are within the scope of the present disclosure, a ball grid array (BGA) 116 is employed to couple the substrates in the illustrated embodiment. The BGA 116 includes a plurality of solder bump balls or other electrically conductive members that may have a substantially spherical shape before and possibly after a reflow process employed to couple the substrates 112, 114 via the BGA 116.

The device substrate 112 may comprise one or more microelectronic devices, such as transistors, electrically programmable read only memory (EPROM) cells, electrically erasable programmable read only memory (EEPROM) cells, static random access memory (SRAM) cells, dynamic random access memory (DRAM) cells and other microelectronic devices, which may be interconnected to form one or more integrated circuits. The device substrate 112 contemplates one or more substrates on or in which one or more conventional or future-developed microelectronic devices may be formed.

The package substrate 114 may comprise a die lead frame, a printed circuit board (PCB), a multiple chip package substrate or other types of substrates. The bulk of the device substrate 112 and/or the package substrate 114 may be a silicon-on-insulator (SOI) substrate and/or may comprise silicon, gallium arsenide, strained silicon, silicon germanium, carbide, diamond and other materials.

The base 120 of the assembly tool 100 is configured to fix the orientation or otherwise support the package substrate 114 during assembly of the microelectronic package 110. For example, as in the illustrated embodiment, the base 120 may comprise a recess 140 configured to receive the package substrate 114, wherein the inner profile of the recess 140 may be substantially similar to the outer profile of the package substrate 114. The recess 140 may be configured such that the package substrate 114 extends from the recess 140 above the base 120 (relative to the illustration) or, alternatively, such that the package substrate 114 is substantially coplanar with the base 120. Of course, coupling means other than or in addition to the recess 140 may be employed to couple the package substrate 114 to the base 120. The base 120 may also be adjustable to allow for different sizes and shapes of the package substrate 114. The base 120 may comprise a thermally conductive material, such as stainless steel, aluminum, nickel, copper, alloys thereof and/or other materials.

The body 130 is configured to receive or otherwise house the device substrate 112, such that the inner profile of the body 130 may be substantially similar to or, as in the illustrated embodiment, larger than the outer profile of the device substrate 112. The body 130 is also configured to form a cavity 132 in conjunction with the base 120 (and possibly the package substrate 114). As such, the body may have a plate or other substantially planar member (hereafter collectively referred to as a plate) 134 and a frame 136 extending from the plate 134. The frame 136 and the plate 134 may be discrete components formed separately and subsequently coupled together, such as by mechanical fasteners, adhesive, welding and/or other processes. The frame 136 and the plate 134 may also be formed integrally, such as by machining a bulk material, injection-molding, casting and/or other processes. The body 130, including the frame 136, plate 134 and/or other portions of the body 130, may comprise a thermally conductive material, such as stainless steel, aluminum, nickel, copper, alloys thereof and/or other materials.

During assembly of the microelectronic package 110, an encapsulant may be injected or otherwise deposited in the cavity 132 formed by the base 120 and the body 130. The encapsulant may comprise a low viscosity epoxy resin material with a solid filler material, wherein the solid filler material may comprise silicon, quartz and/or other materials, including materials having a particle size ranging between about 0.01 microns and about 50 microns. In an effort to confine the encapsulant within the cavity 132 until the encapsulant is allowed to cure or otherwise solidify, a clamping force may be applied to the base 120 and the body 130. The body 130 may also include one or more ports configured to inject encapsulant into the cavity 132. The body 130 may also include one or more apertures or other vents to allow air or other gases to escape the cavity 132 as the cavity is filled with the encapsulant.

The body 130 also includes a seal 138. In the illustrated embodiment, the seal 138 extends around a substantial portion of an inner perimeter of the frame 136. In one embodiment, the seal 138 comprises a trench 139 filled with a seal material. The trench 139 may be formed by machining or otherwise removing material from the body 130. In other embodiments, the trench 139 may be formed simultaneous to forming the body 130, such as when the body 130 is formed by molding or casting. The seal material employed to form the seal 138 may comprise graphite, Teflon® (a product of DuPont of Wilmington, Del.), Kalrez® (a product of DuPont of Wilmington, Del.) and/or other materials. The seal 138 may also comprise multiple seals stacked vertically (relative to the illustration) and/or radially. In one embodiment, the seal 138 may have a depth D ranging between about 0.5 mm and about 4 mm.

Figure 2:
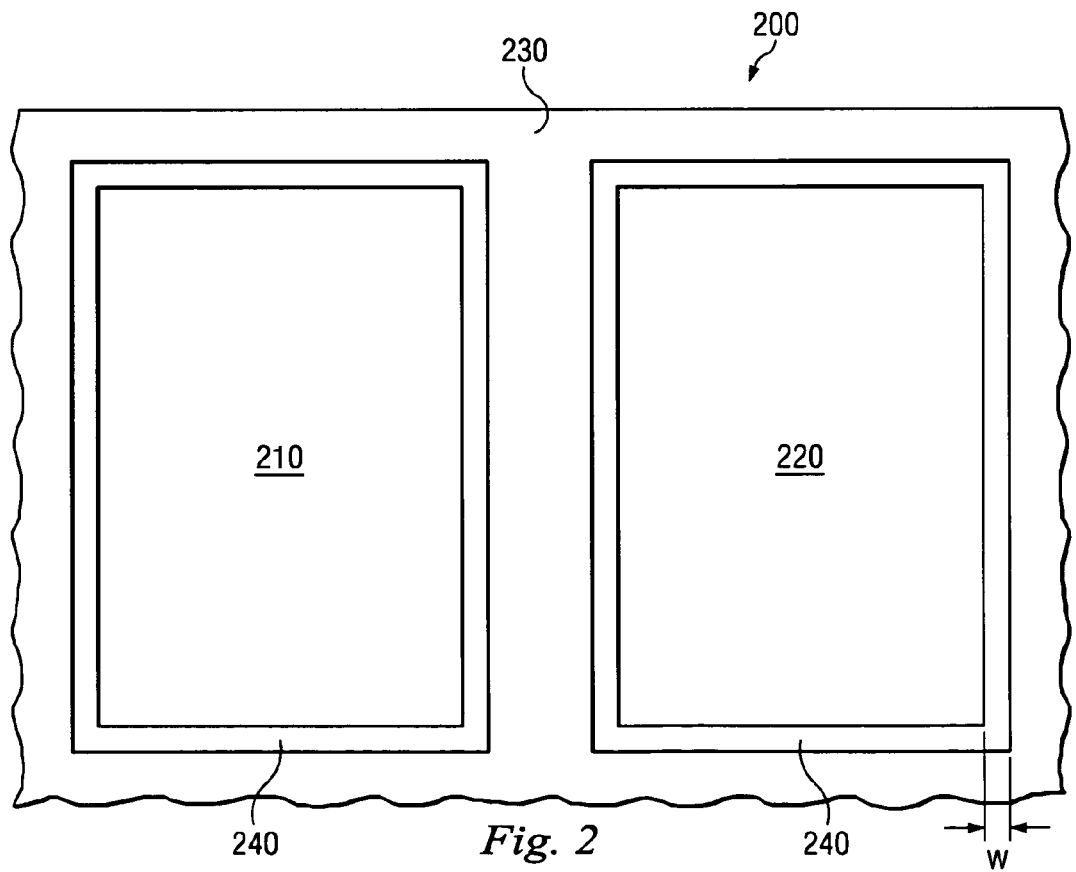
FIG. 2 illustrates a bottom view of another embodiment of a microelectronic package assembly tool constructed according to aspects of the present disclosure.

Referring to FIG. 2, illustrated is a bottom view of an embodiment of the body 130 shown in FIG. 1, herein designated with the reference number 200. The body 200 may be employed in the simultaneous assembly of more than one microelectronic package 100 (shown in FIG. 1). For example, the body 200 may include a first cavity 210 and a second cavity 220 separated by a dividing portion 230 of the body 200. Of course, the body 200 (and the body 130 shown in FIG. 1) may have more than two cavities, within the scope of the present disclosure. For example, in one embodiment, the shape or outer profile of the body 200 may be substantially similar to or otherwise encompass the surface area of a semiconductor wafer employed in the simultaneous fabrication of multiple semiconductor or other microelectronic devices. In such an embodiment, the body 200 may include a cavity for each of the microelectronic devices fabricated on the wafer. The body 200 may also include a trench 240 corresponding to each cavity. The trenches 240 may each be substantially similar to the trench 139 shown in FIG. 1.

Referring to FIGS. 1 and 2 collectively, the bodies 130, 200 may each have a substantially rectangular shape. However, the shapes of the bodies 130, 200 and the trenches 139, 240 are not limited by the scope of the present disclosure, such that other shapes may also be employed therefor, including squares, ellipses, circles, polygons, combinations thereof and/or other geometries. The trenches 139, 240 may also have a width W ranging between about 0.5 mm and about 4 mm.

Figure 3:
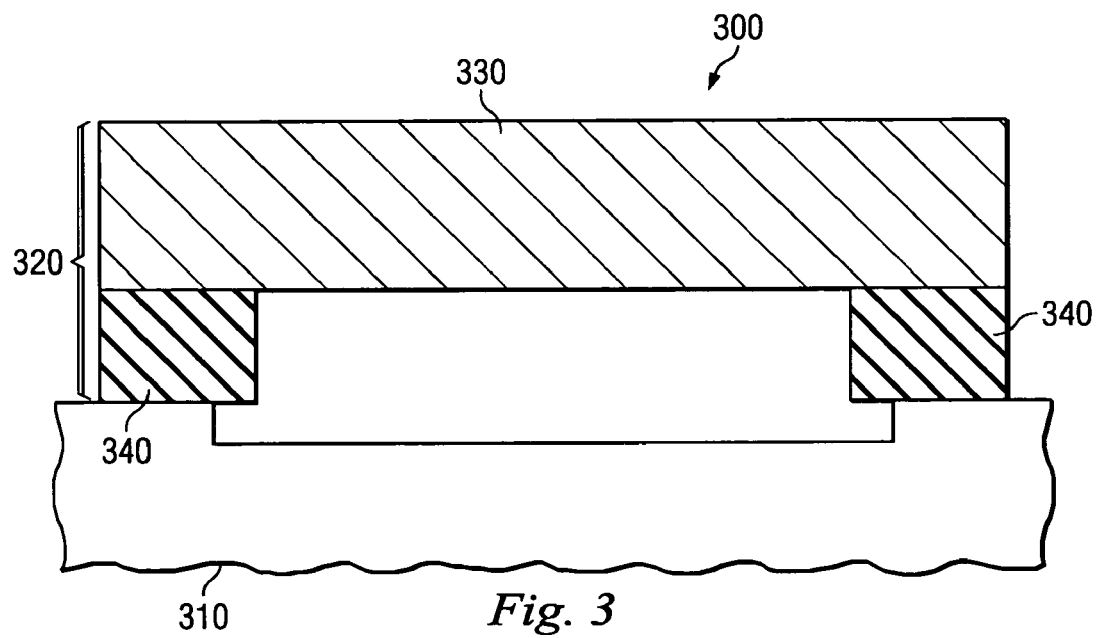
FIG. 3 illustrates a sectional view of another embodiment of a microelectronic package assembly tool constructed according to aspects of the present disclosure.

Referring to FIG. 3, illustrated is a sectional view of another embodiment of the microelectronic package assembly tool 100 shown in FIG. 1, herein designated with the reference number 300. The tool 300 is bifurcated, having a base 310 and a body 320. The base 310 is substantially similar to the base 120 shown in FIG. 1. The body 320 includes a plate 330 which is substantially similar to the plate 134 shown in FIG. 1. The body 320 also includes a seal 340 extending from the plate 330. The seal 340 may be substantially similar in size and shape to the frame 136 shown in FIG. 1, and has a composition that is substantially similar to the seal 138 shown in FIG. 1. The seal 340 is coupled to the plate 330 by mechanical fasteners, adhesive, bonding and/or other means.

Figure 4:
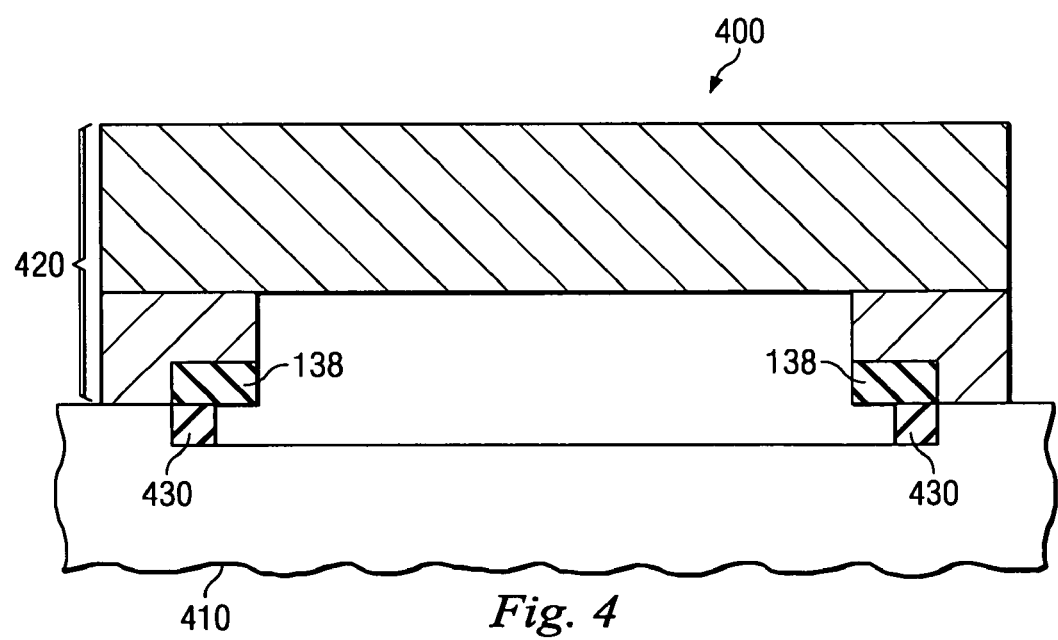
FIG. 4 illustrates a sectional view of another embodiment of a microelectronic package assembly tool constructed according to aspects of the present disclosure.

Referring to FIG. 4, illustrated is a sectional view of another embodiment of the microelectronic package assembly tool 100 shown in FIG. 1, herein designated with the reference number 400. The tool 400 is bifurcated, having a base 410 and a body 420. The base 410 is substantially similar to the base 120 shown in FIG. 1. However, as shown in FIG. 4, the base 410 may also include a seal 430. The seal 430 is substantially similar to the seal 138 shown in FIG. 1. The body 420 is substantially similar to the body 130 shown in FIG. 1. For example, the body 420 includes a seal 138. However, in one embodiment, the tool 400 includes one or more seals in only one of the base 410 and the body 420. That is, in one embodiment, the base 410 includes one or more seals 430 although the body 420 does not include the seal 138.

Thus, the present disclosure introduces a method of manufacturing a microelectronic package comprising, in one embodiment, providing a package substrate, coupling a device substrate to the package substrate, and assembling a bifurcated mold around the device and package substrates, the bifurcated mold including a seal. The method also includes encapsulating the device and package substrates employing the bifurcated mold.

A bifurcated microelectronic package assembly tool is also provided in the present disclosure. In one embodiment, the tool includes a foundation configured to fix an orientation of a package substrate. The tool also includes a body configured to house a device substrate coupled to the package substrate. The tool also includes a seal coupled to one of the foundation and the body.

The present disclosure also provides a microelectronic package assembly tool comprising, in one embodiment, a substantially planar base and at least one wall extending from a surface of the base, the base and the at least one wall defining a cavity configured to receive a microelectronic device. The too also includes a seal inlayed in an interior edge of the wall distal from the base.

The foregoing has outlined several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing a microelectronic package, comprising:
    coupling a device substrate to a package substrate;
    assembling a bifurcated mold around the device and package substrates, the bifurcated mold including a base having a first seal and a body having a second seal, such that the second seal contacts both the first seal and the package substrate; and
    encapsulating the device and package substrates employing the bifurcated mold.

2. The method of claim 1 wherein encapsulating the device and package substrates includes filling the bifurcated mold with encapsulant, wherein the first and second seals collectively prevent the encapsulant from adhering to the bifurcated mold base.

3. The method of claim 1 wherein at least one of the first seal and the second seal comprises graphite.

4. The method of claim 1 wherein at least one of the first seal and the second seal comprises TEFLON.

5. The method of claim 1 wherein at least one of the first seal and the second seal comprises KALREZ.

6. The method of claim 1 wherein the first seal comprises a first trench formed in the bifurcated mold base and filled-with sealant and the second seal comprises a second trench forming in the bifurcated mold body and filled with sealant.

7. The method of claim 6 wherein a width of one of the first trench and the second trench ranges between about 0.5 mm and about 4 mm.

8. The method of claim 6 wherein a depth of one of the first trench and the second trench ranges between about 0.5 mm and about 4 mm.

9. The method of claim 1 wherein the first seal is recessed within the bifurcated mold base and the second seal is recessed within the bifurcated mold body.

10. The method of claim 1 wherein assembling the bifurcated mold around the device and package substrates includes positioning the package substrate in an interior recess in the bifurcated mold base configured to engage the package substrate.

11. A bifurcated microelectronic package assembly tool, comprising:
    a base configured to fix an orientation of a package substrate;
    a body configured to house a device substrate coupled to the package substrate; and
    a first seal coupled to the base and a second seal coupled to the body, wherein the second seal is configured to contact the first seal and the package substrate when the device and package substrates are coupled together and oriented within the base and the body.

12. The bifurcated tool of claim 11 wherein a first inner perimeter of the first seal substantially encompasses a second inner perimeter of the second seal, and wherein outer perimeters of the first and second seals are substantially similar.

13. The bifurcated tool of claim 11 wherein at least one of the first seal and the second seal comprises graphite.

14. The bifurcated tool of claim 11 wherein at least one of the first seal and the second seal comprises TEFLON.

15. The bifurcated tool of claim 11 wherein at least one of the first seal and the second seal comprises KALREZ.

16. The bifurcated tool of claim 11 wherein the first seal comprises a first trench formed in the base and filled with sealant, and wherein the second seal comprises a second trench forming in the body and filled with sealant.

17. The bifurcated tool of claim 16 wherein a width of one of the first trench and the second trench ranges between about 0.5 mm and about 4 mm.

18. The bifurcated tool of claim 16 wherein a depth of one of the first trench and the second trench ranges between about 0.5 mm and about 4 mm.

19. The bifurcated tool of claim 11 wherein the first seal is recessed within the base and the second seal is recessed within the body.

20. The bifurcated tool of claim 11 wherein the base includes a recess configured to engage the package substrate.

21. An apparatus, comprising:
    a base including a plurality of first recesses and a plurality of first seals each extending along a perimeter of one of the first recesses, wherein each of the first recesses and the first seal therein are collectively configured to cooperate to receive and orient a corresponding one of a plurality of package substrates; and
    a body including a plurality of second recesses and a plurality of second seals each extending along a perimeter of one of the second recesses, wherein each of the second seals is configured to contact:
        the first seal of a corresponding one of the first recesses; and
        a corresponding one of the package substrates received by the corresponding first recess and first seal.

22. The apparatus of claim 21 wherein each of the first and second seals comprise a material selected from the group consisting of:
    graphite;
    TEFLON; and
    KALREZ.

* * * * *